(12) United States Patent
Korn

(10) Patent No.: US 6,509,972 B2
(45) Date of Patent: Jan. 21, 2003

(54) TUNABLE FILTER SYSTEM WITH OUT-OF-BAND REFERENCE

(75) Inventor: Jeffrey A. Korn, Lexington, MA (US)

(73) Assignee: Axsun Technologies, Inc., Billerica, MA (US)

( * ) Notice: Subject to any disclaimer, the term of this patent is extended or adjusted under 35 U.S.C. 154(b) by 97 days.

(21) Appl. No.: 09/809,685

(22) Filed: Mar. 15, 2001

(65) Prior Publication Data

US 2002/0131054 A1 Sep. 19, 2002

(51) Int. Cl.⁷ .............................. G01B 9/02; H04B 10/08
(52) U.S. Cl. ....................... 356/519; 359/110; 370/252
(58) Field of Search .............................. 370/252, 264; 359/110, 124; 356/519

(56) References Cited

U.S. PATENT DOCUMENTS

| 6,118,530 A | * | 9/2000 | Bouevitch et al. .......... 356/308 |
| 6,229,631 B1 | * | 5/2001 | Sato et al. ................... 359/110 |
| 6,341,039 B1 | * | 1/2002 | Flanders et al. ............. 359/291 |
| 6,345,059 B1 | * | 2/2002 | Flanders ....................... 372/19 |
| 6,373,632 B1 | * | 4/2002 | Flanders ..................... 359/291 |
| 6,377,730 B1 | * | 4/2002 | Bergmann et al. .......... 359/124 |
| 6,407,376 B1 | * | 6/2002 | Korn et al. ............. 250/227.23 |
| 2001/0019436 A1 | * | 9/2001 | Nakajima et al. ........... 359/110 |
| 2002/0080504 A1 | * | 6/2002 | Atia ........................... 359/872 |

* cited by examiner

Primary Examiner—David V. Bruce
(74) Attorney, Agent, or Firm—J. Grant Houston

(57) ABSTRACT

A tunable filter system comprises a signal source providing a WDM signal having multiple channels within a spectral signal band. A reference source generates a reference signal with spectral reference features that are typically located in a spectral reference band that is outside the signal band. A tunable filter is provided comprising a cavity bounded by at least two reflectors; at least one of these reflectors is a deflecting membrane to thereby create a tunable spectral pass band. The filter has a free spectral range that is greater than a combined bandwidth of the signal band and the reference band. The tunable filter pass band filters the reference signal and the WDM signal.

15 Claims, 5 Drawing Sheets

TUNABLE FILTER SYSTEM WITH OUT-OF-BAND REFERENCE

BACKGROUND OF THE INVENTION

Wavelength division multiplexing (WDM) systems typically comprise multiple separately modulated laser diodes at the transmitter. Each diode generates the signal associated with one of the channels in the WDM signal. These laser diodes are tuned to operate at different wavelengths. When combined in an optical fiber, the WDM optical signal comprises a corresponding number of spectrally separated channels within a signal band. At the receiving end, the channels are usually separated from each other using thin film filter systems, to thereby enable detection by separate photodiodes.

WDM technology enables the collective amplification of the various channels in gain fiber, such as erbium-doped fiber and/or regular fiber, in a Raman pumping scheme. Other WDM applications include the dynamic routing of individual channels in optical WDM networks with multiple network access nodes.

In commercially available and proposed WDM systems, the channel assignments/spacings can be tight, 100 GigaHertz (GHz) to 50 GHz, based on the ITU grid. Further, the number of potential channels on a link can be large. Observation of the ITU Grid suggests 100's of channels on a link in the $L_\alpha$, $C_\alpha$, and $S_\alpha$ bands, even if the 50 GHz offset of the $L_\beta$, $C_\beta$, and $S_\beta$ band is ignored. Still other systems are being proposed that have assignments/spacings in the 10 to 20 GHz range. Thus, each channel must be confined to its channel slot frequency assignment to an absolute accuracy of less than 10 GHz, in some cases.

In order to verify the proper operation of these WDM systems, optical channel monitors are required. These devices typically have a tunable band pass filter that is scanned across the signal band to detect the individual channels. It can thus verify that proper guard bands are being maintained between adjacent channels. They can also be used to verify that the channel powers are consistent with each other such that one channel is not broadcasting with a power that is overwhelming adjacent channels.

In some applications, it is further desirable to have the ability to resolve the absolute wavelengths of the channels. This typically requires some sort of reference signal. Although some systems use capacitive sensing to determine the pass band of the tunable filter, other typically more accurate systems rely on optical reference signals. The filter is scanned across a reference signal with a known and highly stable spectral feature, such as a line of a distributed Bragg reflector laser. This is used to calibrate the tunable laser for a subsequent scan across the signal band of the WDM signal. From this information, the channel monitoring system either extrapolates or interrelates the absolute frequency scale in the WDM signal from the spectral feature in the reference signal.

SUMMARY OF THE INVENTION

The present invention is directed to a tunable filter system, which is preferably used as an optical channel monitor in a WDM system, although it has applicability in any tunable filter application requiring a wavelength reference.

In general, according to one aspect, the invention features a tunable filter system. This system comprises a signal source providing a WDM signal having multiple channels within a spectral signal band. A reference source generates a reference signal with spectral reference features that are typically located in a spectral reference band that is outside the signal band. A tunable filter is provided comprising a cavity bounded by at least two reflectors; at least one of these reflectors is a deflecting membrane to thereby create a tunable spectral pass band. The filter has a free spectral range that is greater than a combined bandwidth of the signal band and the reference band. The tunable filter pass band filters the reference signal and the WDM signal.

In the preferred embodiment, a filter controller is provided that tunes the pass band of the tunable filter successfully across the reference band and the signal band. In the current implementation, the controller passband first crosses the reference band, and then crosses the signal band.

A detector, detecting the beam that is filtered by the tunable filter provides a signal to the controller, which determines an absolute wavelength of the multiple channels within the signal band in response to the reference features in the reference band. In one implementation, the reference signal is generated from a broadband source and a fixed wavelength etalon. A beam combiner is then used to create a combined beam, including the WDM signal that is launched into the tunable filter.

In general, according to another aspect, the invention also features a WDM signal analysis method. This method comprises receiving a WDM signal having multiple channels within a spectral signal band and generating a reference signal having a spectral feature located in a spectral reference band that is outside the signal band. A launch beam is generated by combining the WDM signal and the reference signal. A tunable filter passband is tuned successively across the reference band and the signal band. With this information, the absolute wavelength of multiple channels in the signal band can be determined in response to the reference features in the reference band.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
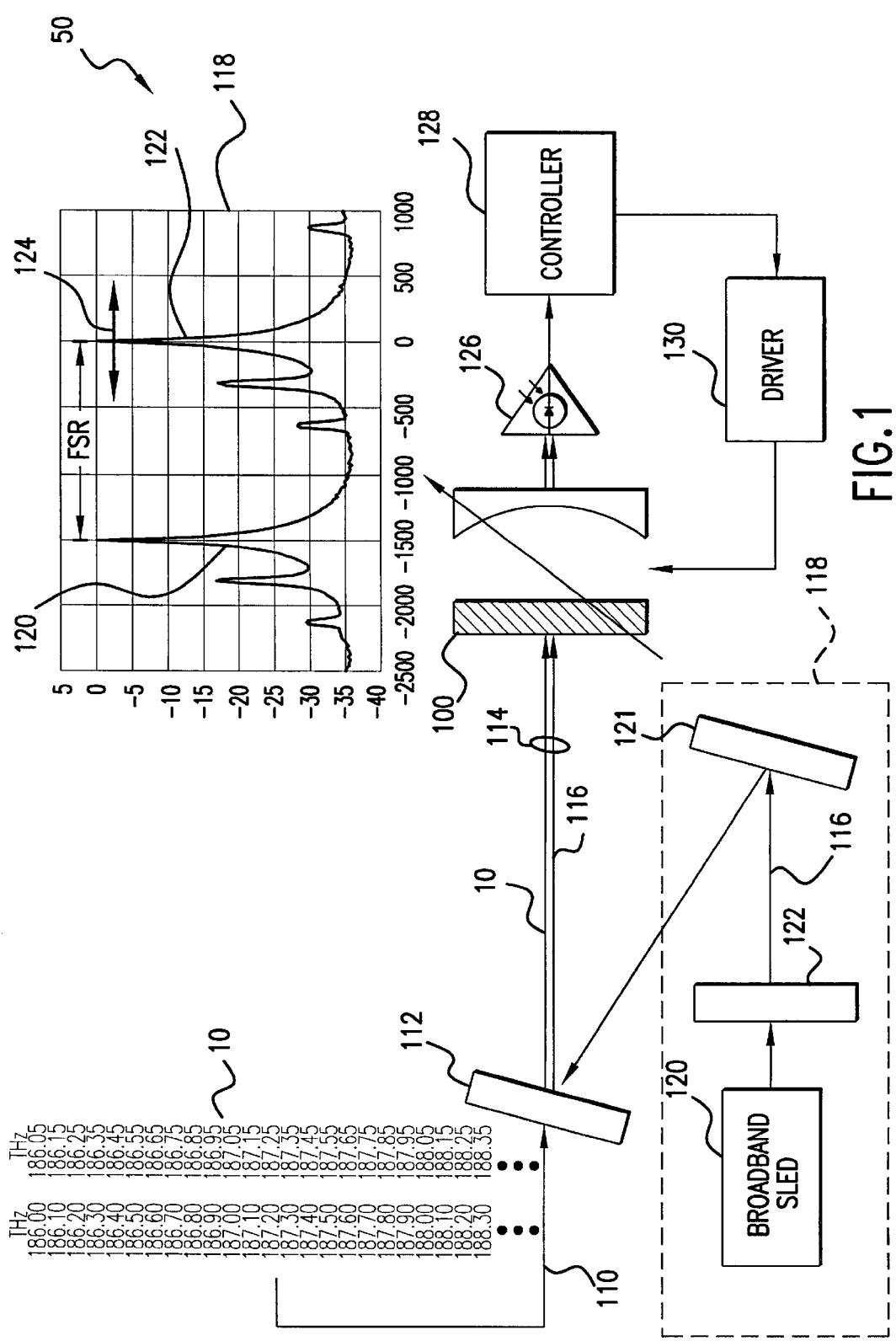
FIG. 1 is schematic view of a tunable filter system with an out-of-band reference, according to the present invention.

FIG. 1 shows a tunable filter system 50, which has been constructed according to the principles of the present invention.

Specifically, a WDM signal 10 is provided to the tunable filter 100, typically via an input optical fiber 110. Within the tunable filter system 50, the WDM signal 110 passes through a WDM filter 112. Specifically, this WDM filter is preferably transmissive to light within the signal band, but reflective to light within the reference band. As a result, the WDM signal is transmitted through the WDM filter 112 to the tunable filter 100. The beam 114 that is launched into the tunable filter 100 also preferably comprises the reference signal 116 in addition to the WDM signal 10.

In one implementation, the reference signal 116 is generated by a reference signal generator 118 that is integrated on the same optical bench as the tunable filter 100. In one implementation, this reference signal generator comprises a broadband super luminescent light emitting diode (SLED) 120. This preferably generates a broad spectrum signal that extends at least over the entire reference band. This signal is then filtered by a fixed Fabry Perot etalon/filter 122. It converts the broadband signal from the SLED 120 into the reference signal 116, having stable, spectrally narrow peaks. The reference signal is then reflected by a filter 121 that functions bandpass filter in reflection. This filter defines the reference band. The WDM filter 112 reflects the reference signal 116 in the direction of the tunable filter 100.

Figure 2:
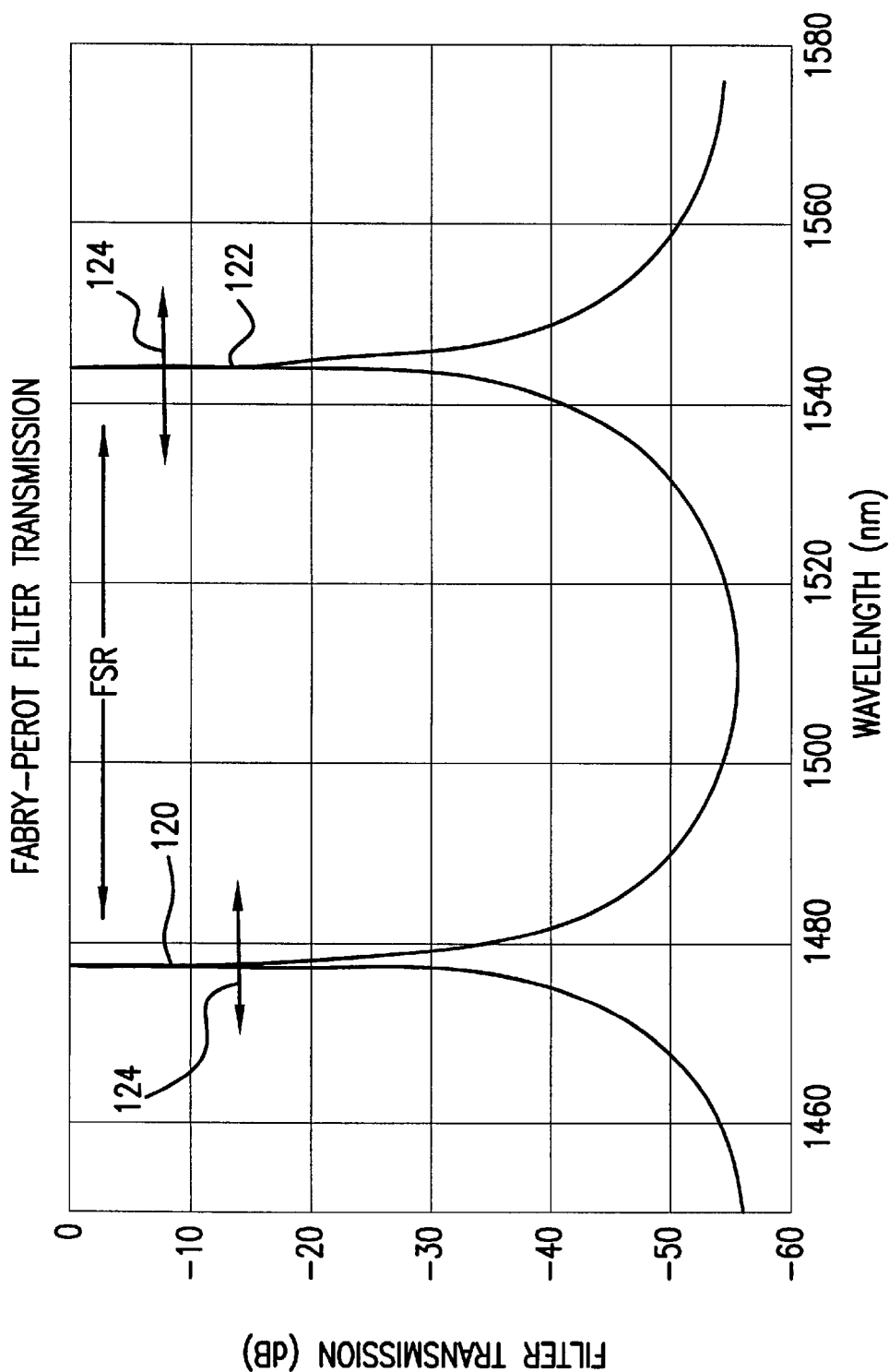
FIG. 2 is a spectral plot of signal transmission as a function of wavelength for the tunable filter.

The tunable filter 100 applies a transmission spectral filtering function as illustrated by the inset 118, as is typical of Fabry Perot filters, and related filters that comprise one or more resonant cavities that are bounded by reflectors. See also FIG. 2. The filter function 118 comprises multiple spectrally discrete peaks 120, 122 that are separated by a spectral distance corresponding to the free spectral range (FSR) of the tunable filter. Membrane deflection moves these peaks 120, 122 spectrally as indicated by arrows 124. This FSR is greater than the combined bandwidth of the reference band and the signal band so that a single mode of the filter can be scanned across both bands serially.

In the instant implementation, the transmission through the tunable filter 100 is detected by a transmission detector 126. Controller 128 monitors the electrical signal from the transmission detector 126 to thereby analyze the spectral content of the combined signal 116. The controller 128 further comprises a filter driver 130 that drives the deflectable membrane of the tunable filter 100.

Figure 3:
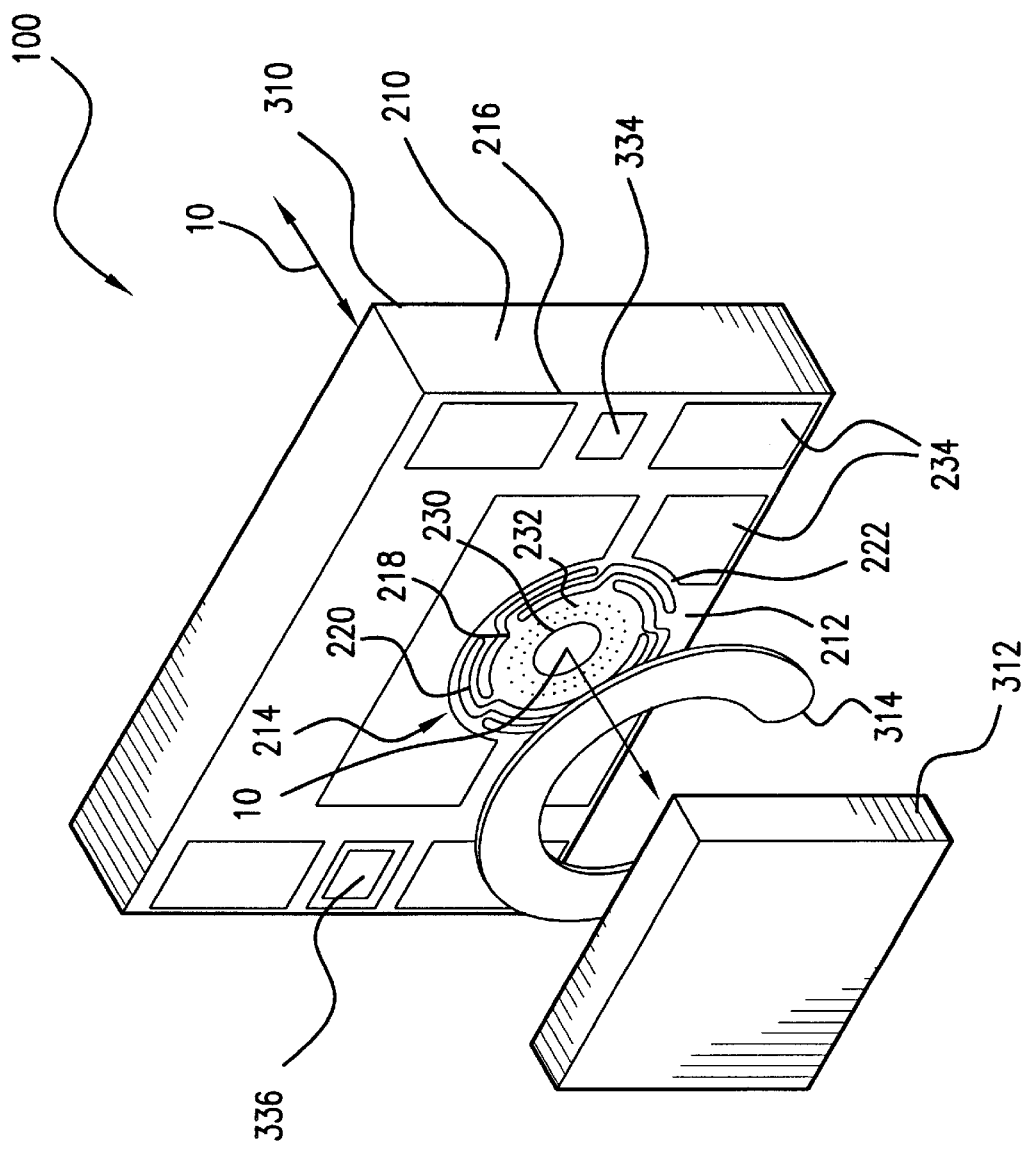
FIG. 3 is a perspective, exploded view of an exemplary Fabry-Perot tunable filter.

FIG. 3 shows an exemplary micro-optical electromechanical system (MOEMS) tunable filter 100 comprising an optical membrane device 310.

Generally, in the filter device 100, a spacer device 314 separates a fixed mirror structure 312 from the membrane device 310.

The optical membrane device 310 comprises handle material 210. Preferably, the handle or support material is wafer material such as from a silicon handle wafer, which has been subsequently singulated into the illustrated device.

An optical membrane or device layer 212 is added to the handle wafer material 210. The membrane structure 214 is formed in this optical membrane layer 212. The membrane layer is manufactured from a silicon wafer that has been bonded to the insulating layer under elevated heat and pressure in one embodiment. Other alternatives are polycrystalline silicon, or essentially single crystal silicon, which have been deposited on the insulating layer.

An insulating layer 216 separates the optical membrane layer 212 from the handle wafer material 210. During manufacture, this insulating layer functions as a sacrificial/release layer, which is partially removed to release the membrane structure 214 from the handle wafer material 210.

In the current embodiment, the membrane structure 214 comprises a body portion 218. The optical axis of combined optical signal 10 of the device 100 passes concentrically through this body portion 218 and orthogonal to a plane defined by the membrane layer 212. Tethers 220 extend radially from the body portion 218 to an outer portion 222, which comprises the ring where the tethers 220 terminate. In the current embodiment, a spiral tether pattern is used.

An optical coating, highly reflecting (HR) dielectric mirror stack 230 is typically deposited on the body portion 218 of the membrane structure 214. In combination with an HR coating on fixed mirror structure 312, a Fabry-Perot resonator cavity is defined. Preferably, either the fixed mirror 312 or the membrane mirror 230 is curved.

In the illustrated embodiment, artifacts of the manufacture of the membrane structure 214 are etchant holes 232. These holes allow an etchant to pass through the body portion 218 of the membrane structure 214 to assist in the removal of the insulating layer 216 during the release process.

In the illustrated embodiment, metal pads 234 are deposited on the proximal side of the membrane device 210. These are used to solder bond, for example, the spacing structure 214 onto the proximal face of the membrane device 210. Of course, it could be avoided if the spacing structure 214 is formed to be integral with the membrane device 310. Bond pads 234 are also useful when installing the filter 100 on a micro-optical bench, for example. Also provided are a membrane layer wire bond pad 334 and a handle wafer wire bond pad 336. The membrane layer bond pad is a wire bonding location for electrical control of the membrane layer. The handle wafer bond pad 336 is a wire bond pad for electrical access to the handle wafer material.

Figure 4:
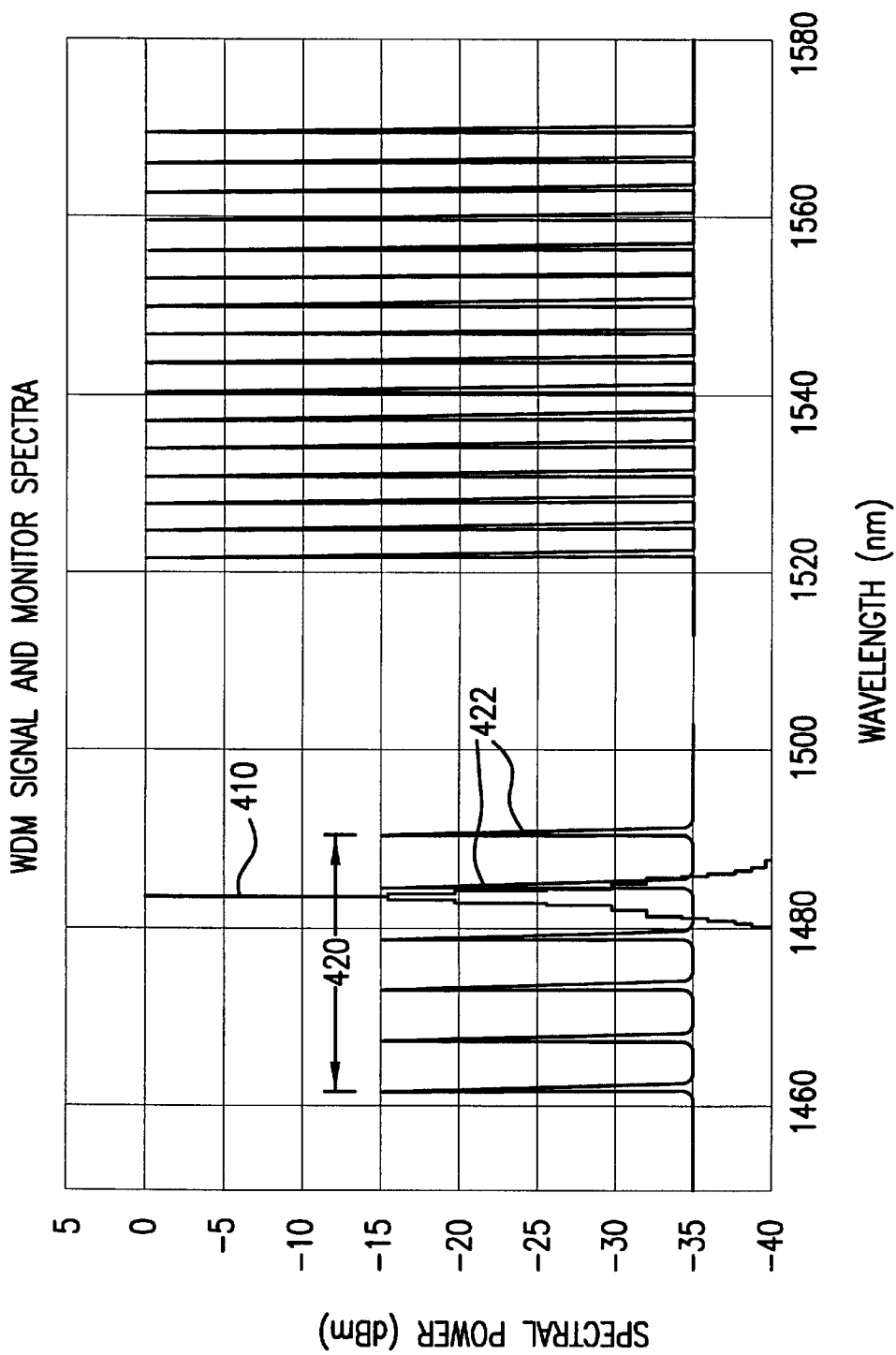
FIG. 4 is a spectral plot of an exemplary WDM signal combined with the reference signal with the filter function tuning across the reference band.
Figure 5:
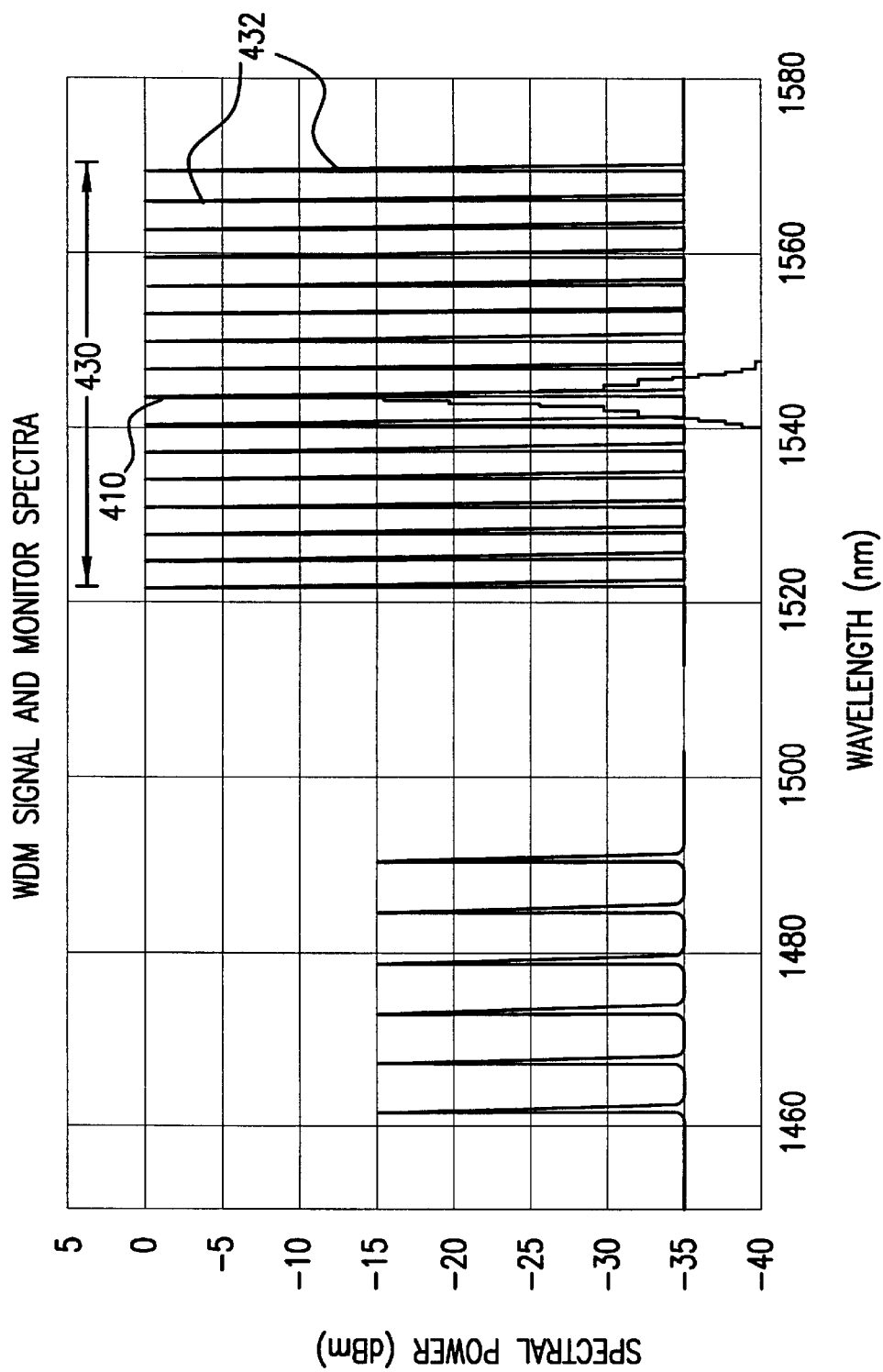
FIG. 5 is a spectral plot of an exemplary WDM signal combined with the reference signal with the filter function tuning across the signal band.

FIGS. 4 and 5 illustrate the operation of the tunable filter system 50. Initially, the mode 120 of the tunable filter 100 is scanned through the reference band 420 as illustrated in FIG. 4. The spectral features 422 within the reference band are generated by the combined operation of the SLED 120 and the etalon 122. The spectral extent of the reference band is dictated by the bandpass filter reflector 121. The detector 126 detects the spectral features associated with the reference signal. The controller uses this information to generate calibration information for the scan of the filter 100. Then, as illustrated in FIG. 5, the filter mode 410 is scanned through the signal band 430 to detect the channels 432. The controller 128 relies on the known and stable spectral location of the spectral features 422 of the reference signal 116 to determine the absolute wavelength during the scan of the WDM signal band 430.

In other implementations, the reference band is located at longer wavelengths than the WDM signal. Further, the signal band 430 is scanned first in other implementations, followed by the reference band 420.

In some embodiments, the reference signal generator 118 is switched off during the scan of the of the signal band 430. This has advantages in lower the noise floor in the detection system by removing ambient light in the package of the system 50.

While this invention has been particularly shown and described with references to preferred embodiments thereof, it will be understood by those skilled in the art that various changes in form and details may be made therein without departing from the scope of the invention encompassed by the appended claims.

What is claimed is:

1. A tunable filter system comprising:
   a signal source providing a WDM signal having multiple channels within a spectral signal band;
   a reference source that generates a reference signal with spectral reference features located in a spectral reference band that is outside of the signal band;
   a tunable filter comprising a cavity bounded by at least two reflectors, at least one of which is a deflectable membrane to create a tunable spectral passband, the filter having a free spectral range that is greater than a combined bandwidth of the signal band and reference band, the tunable filter filtering a beam comprising the reference signal and the WDM signal.

2. A tunable filter system as claimed in claim 1, further comprising a filter controller that tunes the passband of the tunable filter successively across the reference band and the signal band.

3. A tunable filter system as claimed in claim 2, wherein the controller tunes the passband first across the reference band and then across the signal band.

4. A tunable filter system as claimed in claim 2, wherein the controller tunes the passband first across the signal band and then across the reference band.

5. A tunable filter system as claimed in claim 1, further comprising a detector that detects a beam filtered by the tunable filter.

6. A tunable filter system as claimed in claim 5, further comprising a controller, which is responsive to the detector, wherein the controller determines an absolute wavelength of the multiple channels within the signal band in response to the reference features in the reference band.

7. A tunable filter system as claimed in claim 1, wherein the reference source comprises:
   a broadband source; and
   a fixed wavelength etalon that generates the reference features from the emission from the broadband source.

8. A tunable filter system as claimed in claim 6, wherein the reference source further comprises a fixed filter having a passband corresponding to the reference band for filtering the output of the etalon.

9. A tunable filter system as claimed in claim 1, further comprising a beam combiner that generates the beam, from the reference signal and the WDM signal, which combined beam is launched into the filter.

10. A tunable filter system as claimed in claim 1, wherein the tunable filter is a tunable Fabry-Perot filter.

11. A WDM signal analysis method comprising:
    receiving a WDM signal having multiple channels within a spectral signal band;
    generating a reference signal, having spectral reference features located in a spectral reference band that is outside of the signal band;
    generating a launch beam by combining the WDM signal with the reference signal;
    tuning a passband of a tunable filter successively across the reference band and the signal band of the launch beam; and
    determining an absolute wavelength of the multiple channels within the signal band in response to the reference features in the reference band.

12. A method as claimed in claim 10, wherein the tuning step comprises tuning the passband first across the reference band and then across the signal band.

13. A method as claimed in claim 10, wherein the tuning step comprises tuning the passband first across the signal band and then across the reference band.

14. A method as claimed in claim 10, wherein step of generating the reference signal comprises:
    generating a broadband source; and
    generating the spectral reference features within the reference band by passing the broadband source through an etalon and a bandpass filter.

15. A method as claimed in claim 10, wherein the tunable filter is a tunable Fabry-Perot filter.

* * * * *